United States Patent [19]

Hong et al.

[11] Patent Number: 5,646,436

[45] Date of Patent: Jul. 8, 1997

[54] READ ONLY MEMORY (ROM) DEVICE PRODUCED BY SELF-ALIGNED IMPLANTATION

[75] Inventors: Gary Hong; Chen-Chiu Hsue; Chen-Hui Chung, all of Hsinchu, Taiwan

[73] Assignee: United Microelectronics Corporation, Hsinchu, Taiwan

[21] Appl. No.: 536,934

[22] Filed: Sep. 29, 1995

Related U.S. Application Data

[62] Division of Ser. No. 264,461, Jun. 23, 1994, abandoned.

[51] Int. Cl.[6] .................................................. H07L 21/265
[52] U.S. Cl. ................................. 257/390; 257/776
[58] Field of Search .............................. 257/390, 391, 257/776, 377

[56] References Cited

U.S. PATENT DOCUMENTS 5,394,356  2/1995  Yang .............................. 257/377
5,472,898  12/1995  Hong et al. ...................... 437/48

Primary Examiner—Sara W. Crane
Assistant Examiner—David B. Hardy
Attorney, Agent, or Firm—Ladas & Parry

[57] ABSTRACT

A Read-Only Memory (ROM) device produced by self-aligned implantation. First, a non-coded mask ROM with a silicon substrate, a plurality of bit-lines formed in the substrate, a gate oxide layer formed on the bit-lines, and a plurality of word-lines formed on the gate oxide, which together form arrays of memory cells, is provided. Next, an aligning layer is formed above the word-lines. A photoresist is thereafter coated on the surface of the aligning layer. Then, portions of the photoresist not covered by a mask pattern are etched away to the aligning layer so as to provide openings exposing portions of the memory cells that will be programmed to operate in a first conduction state. Portions of the aligning layer exposed through the openings are then removed, after which impurities are implanted through the openings and into the substrate to enable the memory cells that are to operate in the first conduction state, and leave other non-programmed memory cells operating in a second conduction state.

3 Claims, 5 Drawing Sheets

READ ONLY MEMORY (ROM) DEVICE PRODUCED BY SELF-ALIGNED IMPLANTATION

This is a divisional of application Ser. No. 08/264,461 filed Jun. 23, 1994, now abandoned.

BACKGROUND OF THE INVENTION

1. Field of the Invention

The present invention relates generally to a mask ROM process with a self-aligned implantation, and more particularly, to a method of using photoresist as self-aligned mask for ROM coding to resolve the problem of side-diffusion which occurs during the subsequent impurity implantation process. The present invention also relates to the ROM produced by this process.

2. Description of the Prior Art

FIG. 1 shows a plan view of a prior art mask ROM. FIG. 2 shows a cross-sectional view of the prior art mask ROM along the line II—II of FIG. 1. FIG. 3 shows a cross-sectional view of the prior art mask ROM along the line III—III of FIG. 1. As is best illustrated in FIG. 2, the prior art mask ROM comprises: a P-type semiconductor substrate 10; a plurality of N+ type bit-lines 12 formed on the P-type semiconductor substrate 10 by the implantation of impurities there into; a gate oxide layer 14 formed on the surface of the P-type semiconductor substrate 10 and the bit-lines 12; and a plurality of word-lines 16 formed on the gate oxide layer 14, which together form an array of memory cells.

The prior art technique for programming a memory cell of mask ROM 1 involves implanting an impurity 18 which prevents conduction between the two adjacent bit lines 12. This programming technique first involves forming a photoresist layer 20 over the substrate 10. Next, conventional photolithography and etching techniques are used to form an opening 22. Thereafter, boron ions are implanted into the substrate 10 through the opening 22 to form a P type region 18 which is doped so heavily that conduction is cut off even when an electrical potential is applied to the overlying word-line 16.

However, the foregoing prior art method has a drawback in that it is difficult to align the opening 22 accurately on the photoresist 20. If the opening is improperly positioned on the photoresist 20, that causes a side-diffusion effect which is problematic because it can affect the conduction state of adjacent memory cells. For example, a supposedly conducting memory cell can become non-conducting and vice versa due to this side-diffusion effect.

SUMMARY OF THE INVENTION

A principal object of the present invention is to provide an effective and easily implemented method for coding the memory cells of a mask ROM.

Another object of the present invention is to provide a self-aligned coding procedure for a mask ROM that resolves the aforementioned problem of ROM coding misalignment and the side-diffusion of doped impurities caused thereby.

In accordance with the objects of the present invention, a method of self-aligned coding for a mask ROM is disclosed. First, a mask ROM with a silicon substrate, a plurality of bit-lines formed in the substrate, a gate oxide layer formed on the bit-lines, and a plurality of word-lines formed on the gate oxide, which together form an array of memory cells is provided. Pursuant to the disclosed method, an aligning layer, such as a silicon nitride or a silicon dioxide layer, is then formed over the word-lines. Thereafter, a photoresist is coated onto the surface of the aligning layer. Next, when the mask ROM is to be programmed, openings are etched through portions of the photoresist not covered by a mask pattern. The etch occurs to the aligning layer. The resulting openings expose portions of the memory cells that are to be programmed as a first state, for example, an OFF state. The portion of the aligning layer beneath the openings is removed. Impurities are implanted into the substrate through the openings to enable or program selected memory cells to operate in a first state (OFF state) and to leave the remaining memory cells programmed to operate in a second state (ON state).

The disclosed method provides a self-aligned implantation for mask ROM coding, wherein the aligning layer is positioned above the word-lines so that the openings in the photoresist layer act as a self-aligning mask. Accordingly, the problem of impurity side diffusion during coding is resolved without having to revise or add additional photomasks.

BRIEF DESCRIPTION OF DRAWINGS

The present invention can be more fully understood by referring to the following description and accompanying drawings, which form the integral part of this application.

DESCRIPTION OF PREFERRED EMBODIMENT

Figure 1:
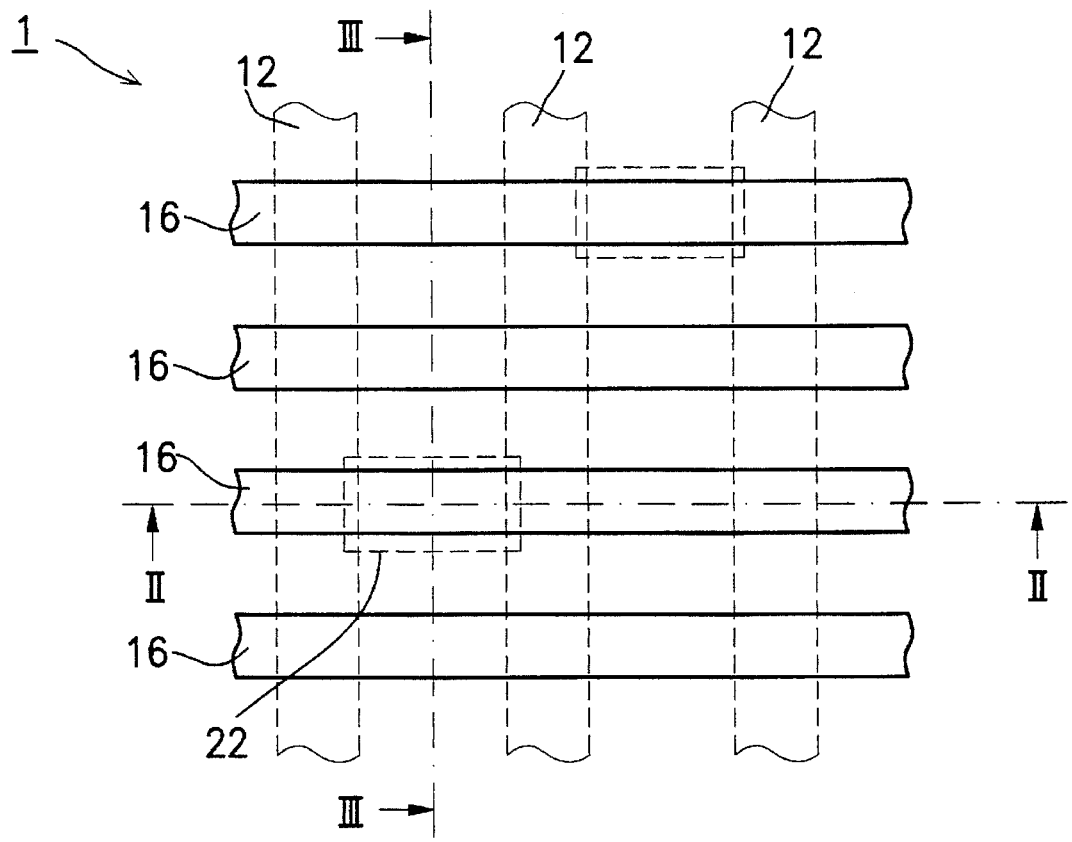
FIG. 1 is a plan view of a prior art mask ROM.
Figure 2:
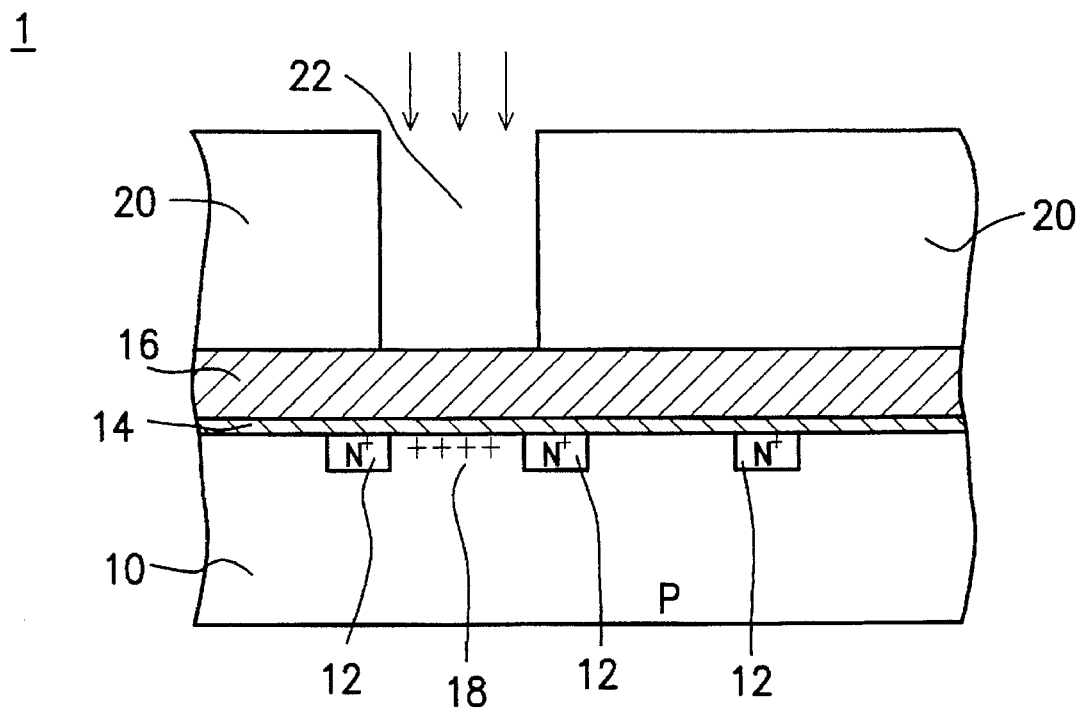
FIG. 2 is a cross-sectional view of the prior art mask ROM of FIG. 1 along the II—II line.
Figure 3:
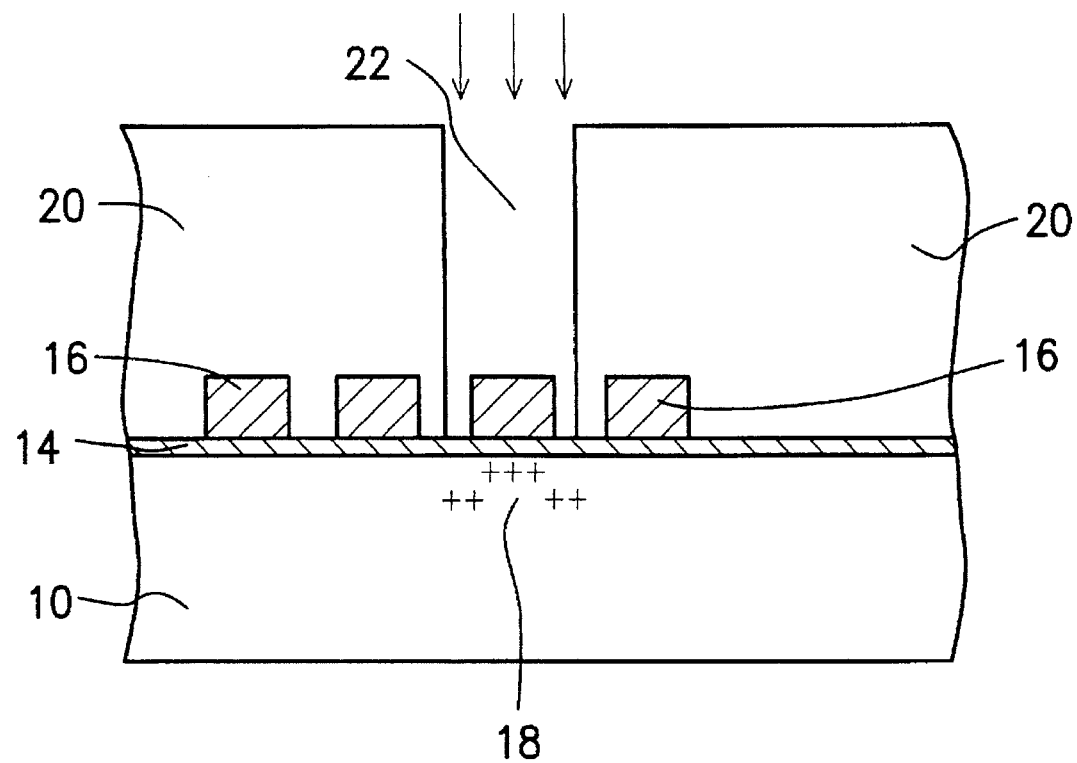
FIG. 3 is a cross-sectional view of the prior art mask ROM of FIG. 1 along the III—III line.
Figure 4:
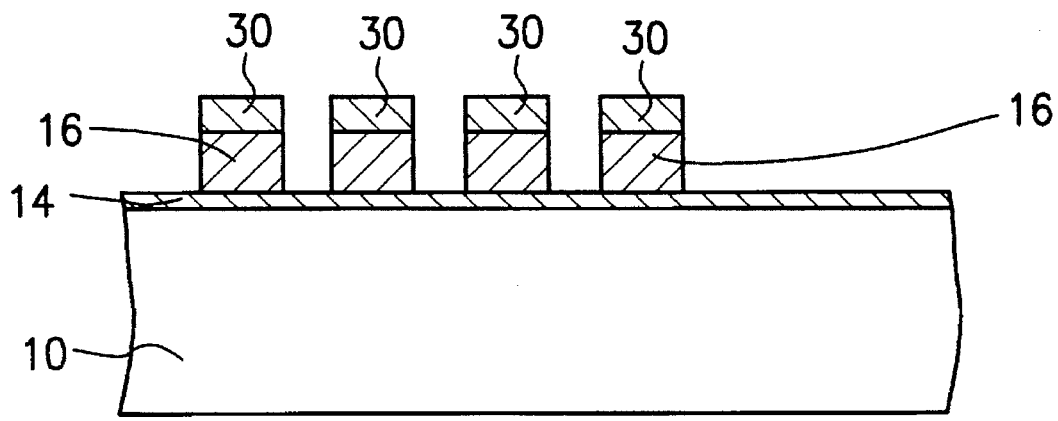
FIG. 4 to FIG. 9 schematically illustrate in cross-sectional representation one preferred embodiment according to the present invention.

FIGS. 4 to 9 are cross-sectional illustrations of the mask ROM 1 during various stages of the coding process of this invention. The self-aligned implantation method of the present invention is suitable for coding the mask ROM 1 as shown in FIGS. 1 and 3. The disclosure hereinafter provided designates mask ROM parts embodying the method of the present invention with reference numerals similar to those of the prior art mask ROM to avoid repetition. The mask ROM 1 fabricated in accordance with the method of the present invention includes: a substrate 10 (N-type or P-type), a plurality of bit-lines 12 (not shown in FIGS. 4 to 9, but they are configured as is shown in FIGS. 1 and 2) formed in the substrate 10, a gate oxide 14 formed on the substrate 10, and a plurality word-lines 16 formed on the gate oxide 14 which together form the memory cells. The self-aligned mask ROM coding method of the present invention includes the following steps:

Step 1:

FIG. 4 illustrates that the uncoded mask ROM 1 includes the gate oxide layer 14 which is formed with a gate oxide thickness of approximately 100~150 Å (Angstrom). Next, a polysilicon layer 16 (or a polycide layer such as $WSi_2$) with polysilicon layer thickness of approximately 3000 Å is deposited over the gate oxide layer 14 by chemical vapor deposition (CVD). Then, a silicon dioxide layer 30 (or silicon nitride layer) with a silicon dioxide layer thickness of approximately 2000–3000 Å is deposited on the polysilicon layer 16. Thereafter, the silicon dioxide layer 30 and the polysilicon layer 16 are patterned using conventional photolithography and etching techniques to form the word-lines 16 and an aligning layer 30.

Figure 5:
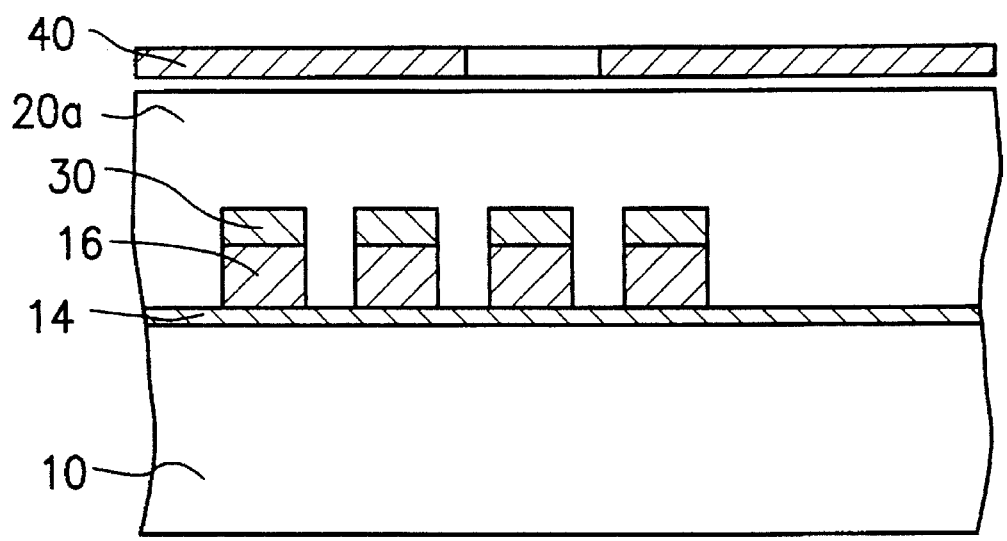

Step 2:

FIG. 5 shows that a photoresist layer 20a is then formed over the substrate 10.

Figure 6:
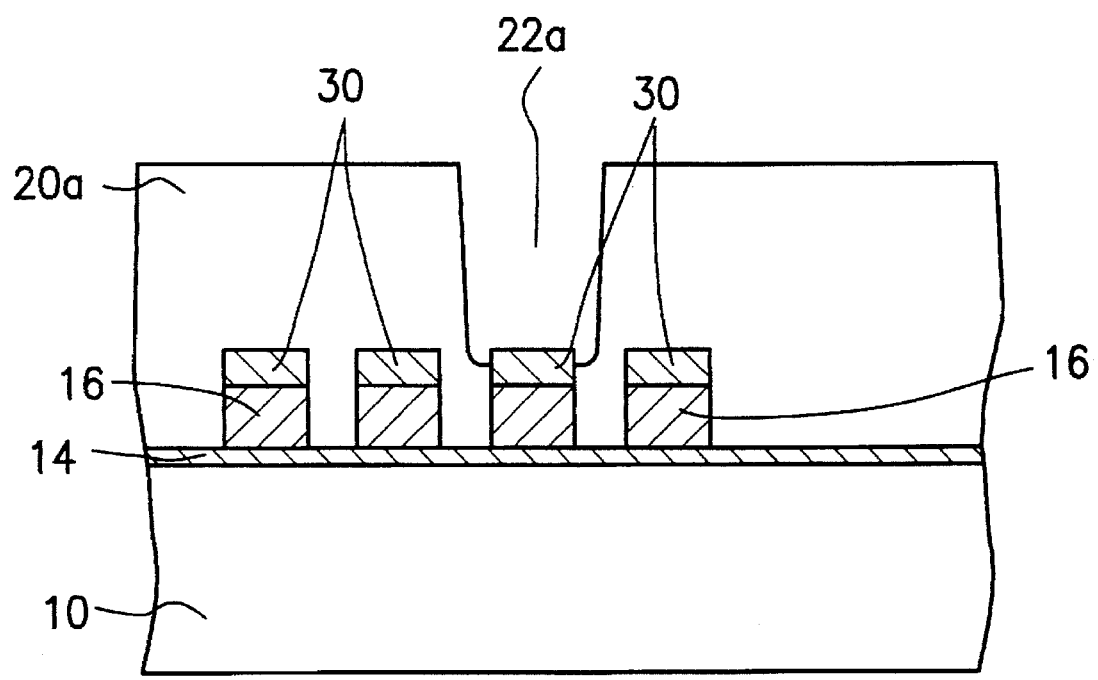

Step 3;

FIGS. 5 and 6 show that the photoresist layer 20a is patterned by a photo-mask 40 to form an opening 22a above a memory cell that is to be programmed to operate in a first conduction state. As is best illustrated in FIG. 6, the opening 22a is etched to the aligning layer 30 so that the layer 30 is exposed through the opening 22a.

Although a limited depth of focus is an inherent problem for the photolithography process, the disclosed invention utilizes this characteristic and properly controls the exposure conditions (intensity, timing . . . etc.) so that only an upper portion of the photoresist layer 20a above the word-lines 16 is developed to form the opening 22a as shown in FIG. 6. The exposure time is appropriately adjusted so that only the upper portion of the photoresist layer 20a is exposed. As may be readily appreciated, different types of photoresist require different exposure conditions. The method of the present invention is additionally advantageous in that it is not necessary to modify or add any photo-masks because the photo-mask 40 used in this step is similar to the one used in the prior art.

Figure 7:
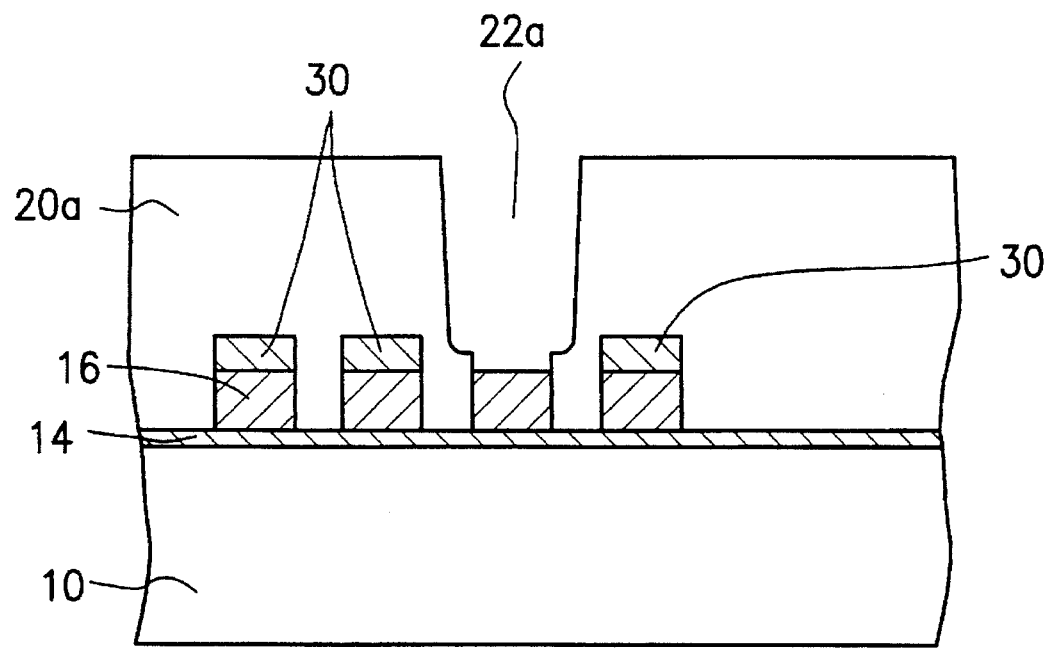

Step 4:

In FIG. 7, the exposed portion of the aligning layer 30 within the opening 22a is removed. If the aligning layer 30 is made of silicon dioxide, it may be removed by applying buffered hydrofluoric acid (BHF). If the aligning layer 30 is made of silicon nitride, it may be removed by a dry etching procedure.

Figure 8:
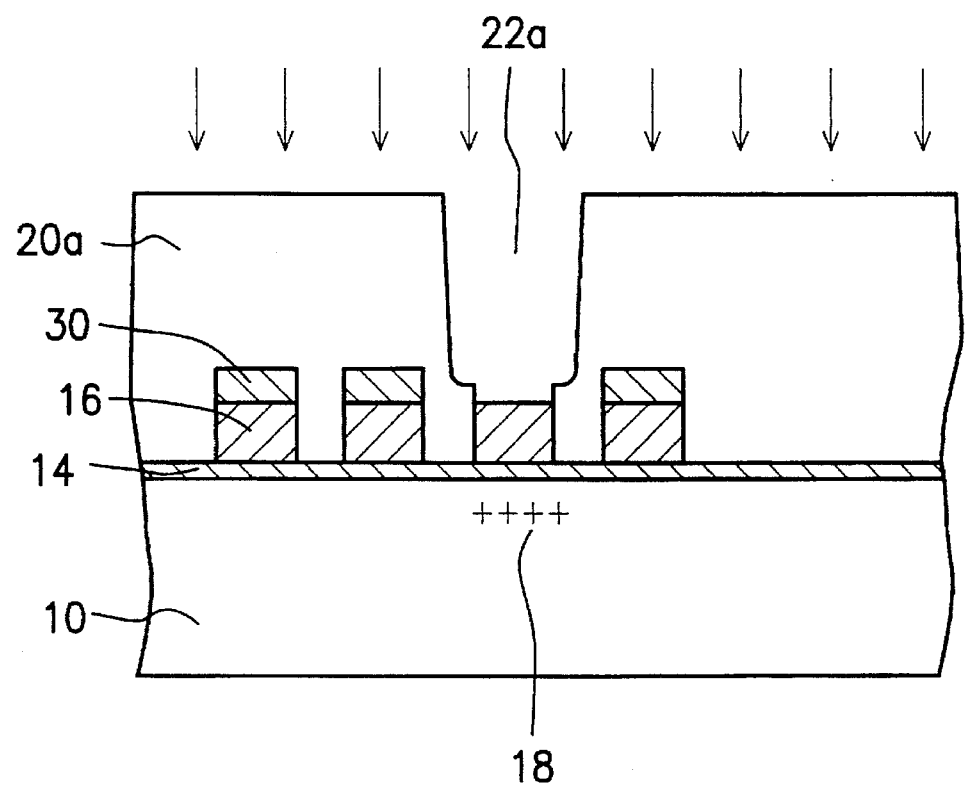

Step 5:

FIG. 8 shows that those memory cells which are to programmed to operate in a first state are programmed by implanting impurities to form a heavily doped region 18. For example, boron ions may be implanted into the P-type substrate 10 with a dosage of $1 \times 10^4$ atoms/cm$^2$ and an implanting energy of 80 KeV to form the doped region 18, with the resulting programmed memory cell being isolated ("OFF") and the other undoped regions (i.e., a second state) being capable of ("ON").

Figure 9:
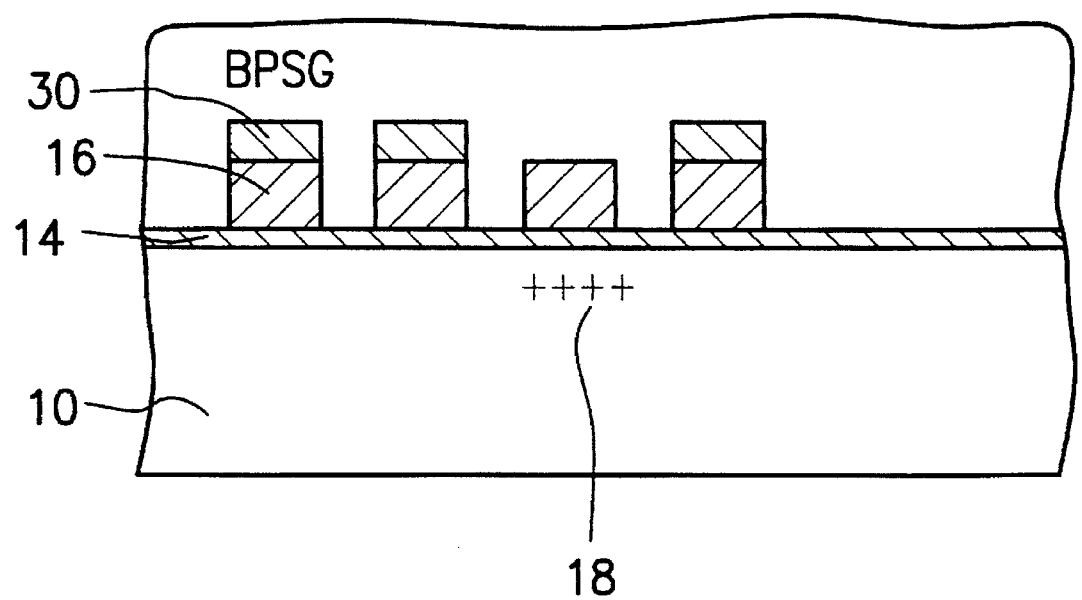

Step 6:

As is shown in FIG. 9, borophosphosilicate glass (BPSG) or borophospho-tetraethylorthosilicate (BPTEOS) with a thickness of approximately 5000–9000 Å is deposited over the implanted region, and then a metallization procedure is performed. The above-described procedures of this step are conventional and, therefore, are not further discussed.

In summary, the disclosed invention provides a method of self-aligned mask ROM coding which is realized by positioning an aligning layer over the word-lines, thereby enabling the openings of the photoresist layer to self-align with the word-lines. As a result, the effect of "side diffusion" during the impurity implantation process for mask ROM coding is eliminated without requiring modifications to existing photo-masks or the use of additional masks. The shape of the resulting opening 22a, as shown in FIG. 7, facilitates accurate ion implantation because the opening 22a narrows to vertically align itself with the edges of the word lines 16.

Although preferred embodiments for this invention are describe above, the disclosed invention is not limited to such embodiments. On the contrary, for anyone skilled in the arts, it is intended to cover various modifications and similar arrangements included within the spirit and scope of the appended claims, the scope of which should be accorded the broadest interpretation so as to encompass all such modifications and similar structures.

What is claimed is:

1. A read only memory device comprising:

(a) a substrate with a plurality of conductive bit-lines formed therein, a gate oxide layer formed on said bit-lines, and a plurality of conductive word-lines formed on said gate oxide, which together form an array of memory cells; and (b) selected ones of said memory cells being programmed to a first state by impurities implanted in said substrate and said selected cells, the remaining cells, which are not programmed to said first state, being characterized by an aligning layer of material which overlies said word-lines of said remaining cells, said material having sidewalls which align with sidewalls of said word-lines, and the selected ones of said memory cells being characterized by not having the aligning layer of material which overlies said word-lines of the selected ones, wherein said material is a layer of silicon dioxide.

2. A read only memory device comprising:

(a) a substrate with a plurality of conductive bit-lines formed therein, a gate oxide layer formed on said bit-lines, and a plurality of conductive word-lines formed on said gate oxide, which together form an array of memory cells;

(b) selected ones of said memory cells being programmed to a first state by impurities implanted in said substrate and said selected cells, the remaining cells, which are not programmed to said first state, being characterized by an aligning layer of material which overlies said word-lines of said remaining cells, said material having sidewalls which align with sidewalls of said word-lines, and the selected ones of said memory cells being characterized by not having the aligning layer of material which overlies said word-lines of the selected ones, wherein said material is a layer of silicon nitride.

3. A read only memory device comprising:

(a) a substrate with a plurality of conductive bit-lines formed therein, a gate oxide layer formed on said bit-lines, and a plurality of conductive word-lines formed on said gate oxide, which together form an array of memory cells;

(b) selected ones of said memory cells being programmed to a first state by impurities implanted in said substrate and said selected cells, the remaining cells, which are not programmed to said first state, being characterized by an aligning layer of material which overlies said word-lines of said remaining cells, said material having sidewalls which align with sidewalls of said word-lines, and the selected ones of said memory cells being characterized by not having the aligning layer of material which overlies said word-lines of the selected ones, wherein a BPSG layer is disposed over said word-lines and said material, said BPSG layer being in direct contact with upper surfaces of said word-lines for those cells programmed to said first conduction state and being spaced from said upper surfaces of said word-lines for those cells not programmed to said first conduction state.

\* \* \* \* \*